United States Patent [19]
Jackson

[11] Patent Number: 5,221,926
[45] Date of Patent: Jun. 22, 1993

[54] CIRCUIT AND METHOD FOR CANCELLING NONLINEARITY ERROR ASSOCIATED WITH COMPONENT VALUE MISMATCHES IN A DATA CONVERTER

[75] Inventor: H. Spence Jackson, Austin, Tex.

[73] Assignee: Motorola, Inc., Schaumburg, Ill.

[21] Appl. No.: 907,075

[22] Filed: Jul. 1, 1992

[51] Int. Cl.⁵ ............................................. H03M 1/06
[52] U.S. Cl. ..................................... 341/118; 341/120
[58] Field of Search ............... 341/118, 119, 120, 121, 341/144, 150

[56] References Cited

U.S. PATENT DOCUMENTS 4,894,656  1/1990  Hwang et al. ..................... 341/120
4,999,625  3/1991  Thompson ......................... 341/118

OTHER PUBLICATIONS

IEEE Proc. CICC, "A 16-Bit 4'th Order Noise-Shaping D/A Converter", Carley et al., pp. 21.7.1–21.7.4, 1988.

A master's thesis paper entitled "Multi-Bit ΣΔ Analog-to-Digital Converters with Nonlinearity Correction Using Dynamic Barrel Shifting" by Y. Sakina, May 1990, Univ. of Calif. at Berkeley, Abstract pg. and pp. 23–26.

*Primary Examiner*—A. D. Pellinen
*Assistant Examiner*—B. K. Young
*Attorney, Agent, or Firm*—Robert L. King

[57] ABSTRACT

A circuit (10) and method for minimizing nonlinearity errors in an oversampled data converter (40) resulting from errors in the intended values of components (42–49) of the converter (40). An adder section (11) is used to add a digital input sample to a previously existing sum generated from an immediately preceding digital input sample. A resulting sum is converter from binary code to thermometer code by an encoder (20). Combinatorial logic (24) is used to provide control signals for controlling switching of the components in a manner which both converts the nonlinearity error to a noise error and frequency shifts the noise error out of a frequency passband of the converter to higher frequencies where the error is subsequently filtered.

14 Claims, 2 Drawing Sheets

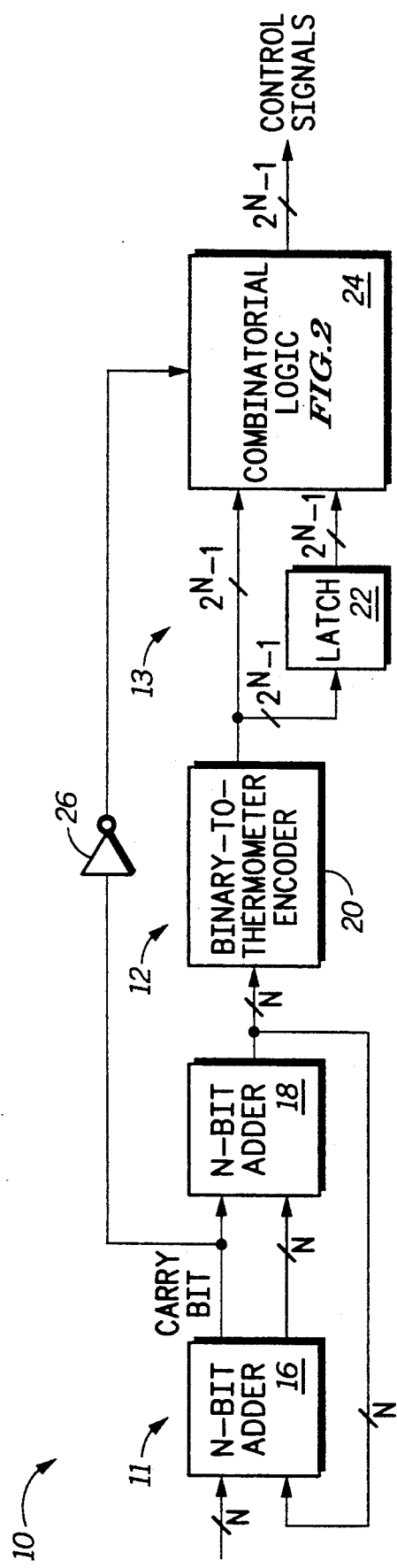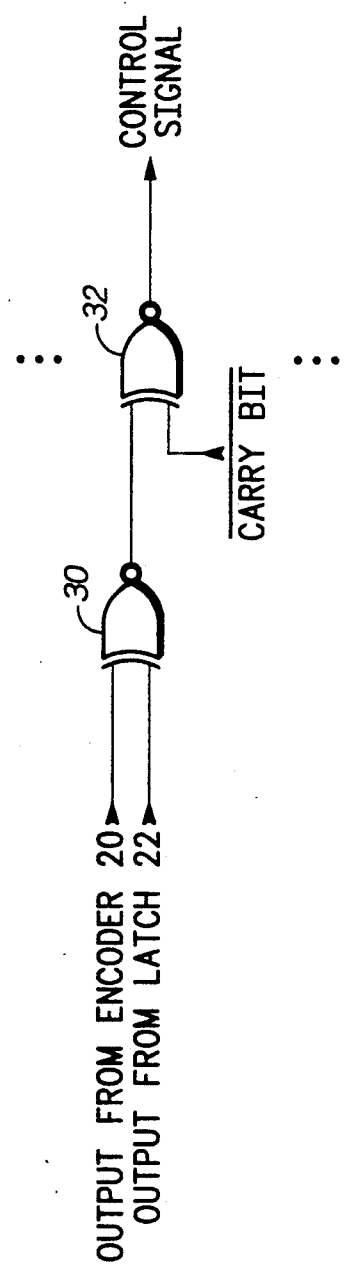

FIG.3 —PRIOR ART—

CIRCUIT AND METHOD FOR CANCELLING NONLINEARITY ERROR ASSOCIATED WITH COMPONENT VALUE MISMATCHES IN A DATA CONVERTER

FIELD OF THE INVENTION

The present invention generally relates to data conversion, and more specifically to oversampled data converters.

BACKGROUND OF THE INVENTION

A fundamental type of digital to analog (D/A) data converter is a Nyquist-type data converter. The Nyquist-type converter inputs digital data into the converter at a Nyquist frequency of twice the frequency of the digital data signal being converted and has a fixed frequency bandwith which is proportional to the converter's operating frequency. The Nyquist-type converter is based on the principal that two samples per cycle will completely characterize a band-limited signal. However, Nyquist-type converters are often implemented with a sampling rate of numerous times higher than the highest input signal frequency (e.g. five to ten times higher). For every doubling in sampling rate of the Nyquist frequency, a reduction of three decibels in signal-to-noise ratio is provided as a result of extending the frequency bandwidth of the converter. To obtain even less noise in a converter output signal, oversampling converters have been implemented by operating at many multiples of the Nyquist frequency. A tradeoff between amount and speed of circuitry and the amount of oversampling exists.

Digital to analog (D/A) converters of the Nyquist type are commonly implemented with a plurality of similar type components, such as resistors, current sources, or capacitors. For example, a well known type of D/A converter utilizes a capacitor array wherein a digital code is encoded into the array by selectively charging predetermined capacitors. The total stored charge is redistributed to provide an analog output voltage. When each capacitor in a capacitor array has the same value, the capacitive digital to analog converter is said to be monotonic. To implement an N-bit capacitive monotonic converter requires $(2^N-1)$ capacitors, where N is an integer. Component value variations which collectively occur from one end of a capacitor array to another end, representing a sum of all individual variations between adjacent or successive components, form a total linearity error of the digital to analog converter. The linearity error manifests itself in the frequency domain in the form of discrete signal-to-distortion error components at harmonic frequencies of the signal frequency. Because component value matching is a fundamental process limitation, techniques to compensate for linearity errors in a data converter are typically required. For example, as a result of process limitations to repeatedly form precise component values, the output linearity is typically limited to approximately ten bits of resolution in existing capacitive digital-to-analog converters. Unfortunately, the oversampling performed in oversampled data converters reduces quantization noise but has no effect on linearity errors.

To compensate for output linearity problems in digital-to-analog converters having a plurality of components with pre-defined values, others have used calibration techniques to adjust each component value relative to a reference value. The calibration techniques typically require a hardware calibration circuit which requires additional circuit area and an operating cycle during which the calibration occurs.

Another known nonlinearity correction technique in digital-to-analog converters, such as capacitor array converters, is to randomize the switching order of the capacitors in the capacitor array. The randomization of component switching reduces the effects of nonequal component values. Randomized component switching changes the nonlinearity error from noticeable signal-to-distortion errors having components at the harmonic frequencies in the frequency bandwidth to random white noise error which is spread out thru the frequency bandwidth. Therefore, the randomization of component switching has a greater performance impact in a highly oversampled data converter having a greater frequency bandwidth as opposed to a converter operating at the Nyquist frequency with a shorter frequency bandwidth.

In order to accomplish the random switching in a converter having a plurality of components, such as a capacitor array, others have implemented logic circuitry to provide control signals which randomly switch the capacitors in the capacitor array. The size associated with known random number generators which may be used to implement the known randomization technique typically prohibits the use of this alternative in large scale integration semiconductor devices. Also, random number generators which are implemented are not truly random because the generators have a finite number of possible outputs which are generated. Because only a pseudo-random number generator is physically possible to implement, not all of the nonlinearity is converted from signal-to-distortion error to noise error.

Another type of oversampling data converter, which is not considered a Nyquist data converter, is referred to as a sigma delta data converter. Sigma delta data converters perform frequency oversampling but use noise shaping techniques which are fundamentally distinguishable from Nyquist sampling theory. Sigma delta data converters also use fixed component values which introduce nonlinearity output errors when the values are not exact. Random switching of the components has also been implemented in sigma delta data converters to convert nonlinearity errors into white noise which is spread out over the entire frequency bandwidth. However, a significant amount of converted white noise remains in the passband portion of the frequency bandwidth.

SUMMARY OF THE INVENTION

In accordance with the invention, there is provided a circuit and method for cancelling nonlinearity error associated with component value mismatches in a data converter. The data converter has a plurality of components which are each selectively switched between first and second terminals to perform a predetermined data conversion. Arithmetic circuitry successively receives a plurality of digital input signals, the arithmetic circuitry successively performing a predetermined arithmetic operation for each digital input signal and using an immediately preceding output of the arithmetic circuitry to provide an arithmetic output for each received input signal. A first of the digital input signals is used with a predetermined value to perform the predetermined arithmetic operation. An encoder is coupled to the arithmetic circuitry for receiving the arithmetic output provided in response to each received digital input signal. The encoder translates the arithmetic output from a first predetermined digital code value to a second predetermined digital code value. Control signal circuitry is coupled to the arithmetic circuitry and the encoder, the control signal circuitry providing a plurality of control signals for controlling switching of the plurality of components in a predetermined order to cancel the nonlinearity error by switching a predetermined number of the components for each received digital input signal as determined by the second predetermined digital code value and in a nonrepetitive successive order with respect to successive digital input signals. The successive order of switching of components is repeated for subsequent digital input signals after one or more of the digital input signals has generated enough control signals to cause each of the components to be switched once.

These and other features, and advantages, will be more clearly understood from the following detailed description taken in conjunction with the accompanying drawings. It is important to point out that there may be other embodiments of the present invention which are not specifically illustrated.

BRIEF DESCRIPTION OF THE DRAWINGS

FIG. 1 illustrates in block diagram form an error cancellation circuit in accordance with the present invention;

FIG. 2 illustrates in logic diagram form a portion of the combinatorial logic illustrated in FIG. 1;

FIG. 3 illustrates in partial schematic form a known digital-to-analog converter.

DETAILED DESCRIPTION OF A PREFERRED EMBODIMENT

Figure 4:
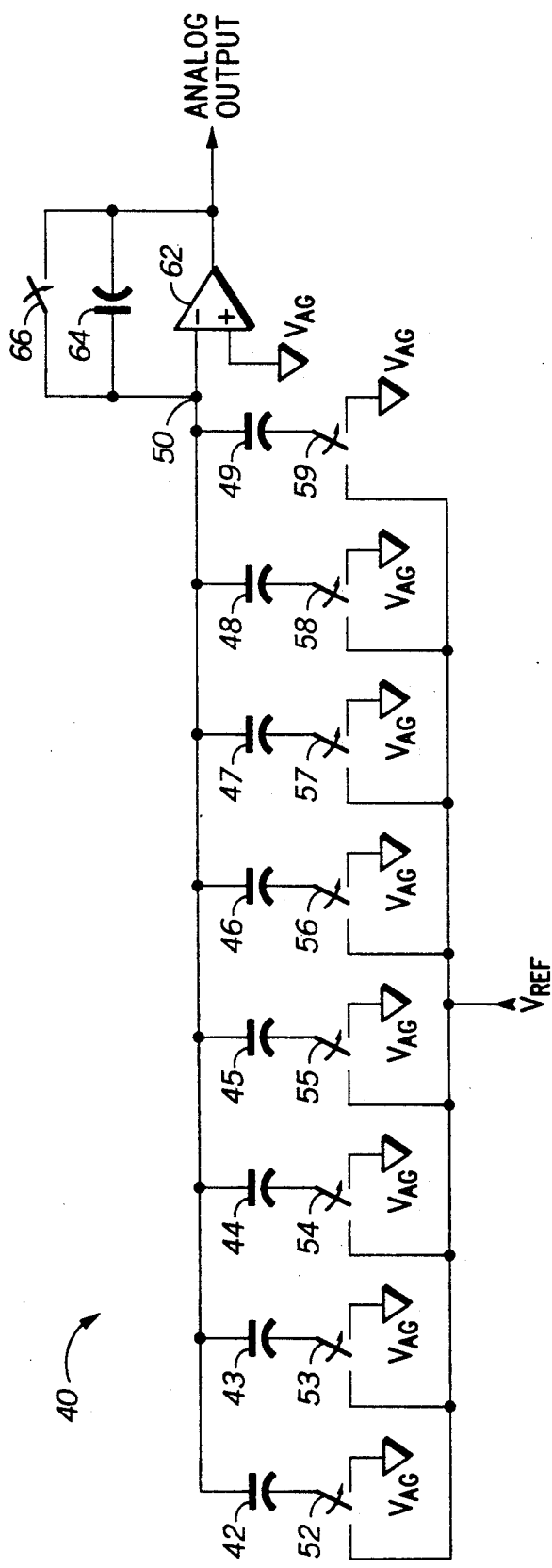
FIG. 4 illustrates in table form the method of error cancellation in accordance with the present invention when applied to the converter of FIG. 3.

Illustrated in FIG. 1 is an error cancellation circuit 10 for use with a data converter, particularly a digital-to analog (D/A) converter. In general, circuit 10 has an adder portion 11, an encode portion 12, and an output portion 13. In adder portion 11, an N-bit adder 16, where N is an integer, has a first input for receiving N bits of a digital input signal which is to be converted to a corresponding analog value by a D/A converter (not illustrated). Adder 16 has an N-bit sum output which is connected to a first input of an N-bit adder 18. A carry bit output of adder 16 is connected to a second input of adder 18. Adder 18 provides an N-bit sum output which is connected to a second input of adder 16.

In the illustrated form, encode portion 12 is a binary-to thermometer encoder 20 having an input connected to the N-bit sum output of adder 18. The binary-to thermometer encoder 20 is a conventional circuit which converts from the conventional binary code to the conventional thermometer code. Encoder 20 provides an encoded output in thermometer code which has $(2^N-1)$ bits.

Output portion 13 has a latch 22 having an input connected to the output of encoder 20. An output of latch 22 is connected to a first input of a block of combinatorial logic 24. The output of encoder 20 is also connected to a second input of combinatorial logic 24. A third input of combinatorial logic 24 is connected to a logical inverse of the carry bit signal provided by adder 16. Accordingly, an inverter 26 has an input connected to the carry bit output of adder 16. An output of inverter 26 is connected to the third input of the combinatorial logic 24. Combinatorial logic 24 has an output which provides $(2^N-1)$ signals labeled "Control Signals" which are used as described below.

To further understand the combinatorial logic 24, FIG. 2 illustrates one bit path of the logic. As noted by the repeating dots in FIG. 2 there are other bit paths not illustrated which form a total of $(2^N-1)$ bit paths. In FIG. 2, an exclusive NOR gate 30 has a first input for receiving a predetermined one of the bit outputs of encoder 20. Exclusive NOR gate 30 has a second input for receiving a corresponding predetermined one of the bit outputs of latch 22. An output of exclusive NOR gate 30 is connected to a first input of an exclusive NOR gate 32. A second input of exclusive NOR gate 30 is connected to the output of inverter 26 for receiving the logical inverse of the carry bit. An output of exclusive NOR gate 32 provides a predetermined one of the $(2^N-1)$ control signals labeled "Control Signal."

In operation, circuit 10 functions to receive an N-bit digital signal and provide $(2^N-1)$ control signals for use in a D/A data converter (not illustrated). More particularly, the data converter has a plurality of components, such as capacitors, which each have a terminal that is switched between first and second reference voltage terminals in response to one of the $(2^N-1)$ control signals. It should be well understood that any type of monotonic data converter may be used in conjunction with the present invention. The control signals provided by circuit 10 function to randomize the switching of components, whether the components are capacitors, current sources or other circuitry, when a digital input is being input into the data converter. Therefore, circuit 10 may be considered as part of the data converter. Because the circuitry of the data converter which is switched and controlled by the control signals provided by circuit 10 is well known in the literature, such circuitry is not herein illustrated.

The present invention functions to implement random switching of the components in a data converter. In one form, the components of the data converter may be implemented as a plurality of equal valued capacitors in a capacitive array. For example, FIG. 3 illustrates a conventional data converter 40 which the present invention may be used with. Generally data converter 40 has a plurality of equal valued capacitors 42-49. Because capacitors 42-49 cannot be made to have values which are substantially equal, the resulting effect is nonlinearity error in the output of data converter 40. Each of capacitors 42-49 has a first electrode connected together at a node 50 and to a negative input of an operational amplifier 62. Each of capacitors 42-49 has a second electrode which is respectively connected to a predetermined one of a plurality of switches 52-59. Each of switches 52-59 connects the second electrode of a predetermined capacitor to either an analog ground terminal, labeled "$V_{AG}$", or to a reference voltage, labeled, "$V_{REF}$", in response to one of the control signals provided by circuit 10. A positive input of operational amplifier 62 is also connected to the analog ground terminal $V_{AG}$. A feedback capacitor 64 has a first electrode connected to node 50 and a second electrode connected to an output of operational amplifier 62 for providing an analog output signal labeled "Analog Output." A discharge switch 66 is connected across capacitor 64 by having a first terminal connected to the first electrode of capacitor 64 and a second electrode connected to the output of operational amplifier 62.

The switching taught herein may be better understood by referring to FIG. 4 which refers to converter 40 of FIG. 3 by way of illustration only. The number of switches 52-59 which are required to be conductive for a particular thermometer code input sample will vary for each received sample. In particular, in FIG. 4 an "X" is used in a column associated with a predetermined switch of converter 40 to indicate when that switch is to be connected to the reference voltage. Otherwise, the switch remains connected to the analog ground voltage. It should be noted that the total number of switches to be connected to the reference voltage for a particular thermometer code input is equal to the number of binary ones contained in the thermometer code. It should be well understood that although data converter 40 is illustrated having eight capacitors, the present invention may be used with a converter having any number of equal valued capacitors. Also, although converter 40 is a Nyquist-type converter, it should be well understood that the present invention may be applied to any type oversampling data converter, including a sigma delta data converter.

Assume in FIG. 4 that an equivalent thermometer code of "0111" is the first sampled digital input. The first three switches which are made conductive are switches 52-54 as noted by an "X". Switches 52-54 respectively charge capacitors 42-44 to the reference voltage while capacitors 45-49 remain charged at an analog ground potential. Again, three switches are required because there are three binary ones in the value. Assume that the first three capacitors of the capacitors are switched and a conversion to an analog value is made by converter 40 in a conventional manner.

Now assume that the second digital input sample has an equivalent thermometer code of "0111111" as illustrated in FIG. 4. To implement the D/A conversion of this thermometer code value, six switches must be made conductive corresponding to the presence of six binary ones. The present invention implements randomization of the switching by causing switches 55 thru 59 and switch 52 to be switched in a round robin manner. In other words, the randomization effect taught herein also functions by always progressing in serial order thru an assigned component order and then wrapping back around to the first component and continuing forward, only switching as many components as there are binary ones in the received sample when converted to thermometer code. If a subsequent third digital sample value has an equivalent thermometer code of "011" requiring two switches to be made conductive, the two switches which are made conductive are switches 53 and 54 because switch 52 was last switched in the second sample. The operation of the switches continues in this manner for subsequent switching. Although the switching taught herein is ordered, the effect is to randomize the switching of components, but with improved advantages as described below.

Referring again to FIG. 1, adder 16 functions to add the digital input signal with the previously existing sum generated from an immediately preceding digital input sample. Therefore, adder 18 should be implemented with flip-flops or analogous circuitry so that the output sum can be stored or held until the next digital input signal is received. For the initial input sample, adders 16 and 18 are reset to provide a predetermined initial input, such as all zeroes, to the second input of adder 16. In one form, the first digital input sample is added with all zeroes by adder 16. An output carry bit is generated when there is an overflow of the N-bit sum of adder 16, such as for example, when the most significant bit of each of the digital values being summed by adder 16 is a logic one. In those situations where an output carry bit is generated, the carry bit should be subsequently added to the least significant bit of the N-bit sum provided by adder 16. This function is implemented by adder 18. It should be well understood that adders 16 and 18 may be implemented by the same hardware circuit even though two separate adders are illustrated in FIG. 1. Two discrete adders are illustrated in FIG. 1 only for the purpose of more clearly illustrating the functional operation of the present invention. After an N-bit sum of the existing sampled digital input and the previous sum is generated, encoder 20 functions to convert the digital value from a binary value to the conventional thermometer code which is required as explained above to determine the total number of the $(2^N-1)$ switches which the control signals will switch states. Encoder 20 may be implemented with any type of conventional binary-to-thermometer code converters. The combinatorial logic 24 functions on a bit level to perform an exclusive NOR of the present output of encoder 20 with an immediately preceding output of encoder 20 stored in latch 22. Latch 22 may be reset to an all logic zero state for initial operation when the first thermometer code value is provided by encoder 20. The output of exclusive NOR gate 30 is then exclusive NORed with an inverse of the carry bit to determine the logic state of one of the $(2^N-1)$ control signals. In this manner, combinatorial logic 24 functions to provide $(2^N-1)$ control signals which implement the randomized component switching described above. Combinatorial logic 24 uses both the present digital input signal in thermometer code and the immediately preceding digital input signal in thermometer code to be able to determine which component was the last component which was switched in connection with the immediately preceding digital input signal and which component should be the first component to be switched associated with the present input signal. The information of whether or not a carry bit is generated in connection with the present input signal value is also used by combinatorial logic 24 to determine the logic value of each control signal. Therefore, the present invention functions to guarantee that a new input sample does not begin with a switch which was the last active switch of the preceding digital input sample.

By implementing the switching order as illustrated in FIG. 4, the effect is significantly improved over the known advantages of using hardware pseudo-random number generators to implement the switching. In particular, circuit 10 functions to remove nonlinearity error components from the output of a data converter. The nonlinearity error components are normally in the form of signal to distortion components at the harmonic frequencies in the bandwidth of a data converter. Known randomization techniques tend to convert these signal to distortion components to noise which is spread out thru the entire bandwidth. A disadvantage with the previous techniques is that the error is still present in the form of noise in the passband frequency range of the data converter. Therefore, although the nonlinearity error is reduced there still remains a significant amount of error in the passband of the data converter. In contrast, the switching technique taught herein has the effect of both converting the signal to distortion error components at the harmonics to noise and frequency shifting or modulating most of the converted noise out of the passband up to much higher frequencies in the converter's bandwidth which are filtered out.

It should be noted that the way the nonlinearity error is modulated to higher frequencies is dependent upon both the sampling frequency of the data converter (i.e. how often the components are being switched) and the frequency of the digital input signal being converted. As a result, the present invention is particularly beneficial in highly oversampled data converters such as sigma delta data converters. The resulting effect is that the present invention has a significantly improved signal to noise ratio in the passband of a data converter, as opposed to the same data converter using known nonlinearity error techniques, such as randomized switching and component calibration techniques. However, even in Nyquist-type converters operating at five to ten times the Nyquist fundamental frequency, performance improvement is realized by using the error correction circuit taught herein.

By now it should be apparent that there has been provided an error correction circuit for use with oversampled data converters. The present invention compensates for nonlinearity errors associated with mismatched component values by converting the error to noise and shifting the noise to higher frequencies as opposed to spreading the noise out over an entire frequency bandwidth of the converter.

Thus it is apparent that there has been provided, in accordance with the present invention, a nonlinearity error correction circuit for a data converter that fully meets the need and advantages set forth previously. Although the invention has been described and illustrated with reference to specific embodiments thereof, it is not intended that the invention be limited to these illustrative embodiments. For example, latch 22 may be implemented as a part of the output of encoder 20 or the combinatorial logic 24. The present invention may be applied to a data converter having current sources, resistors, or other components rather than capacitors. It should also be well understood that although the present invention has been described in the context of digital-to-analog (D/A) conversion, the present invention may be also be used in the feedback path of a sigma delta analog-to-digital (A/D) conversion or in a successive approximation register (SAR) of other types of A/D converters. It should also be appreciated that the function of adders 16 and 18 may be modified to perform two's complement addition and perform a subtraction operation rather than an addition to implement the present invention. Also, the switching order of components, although illustrated from a left-to-right orientation in FIG. 4, may be readily modified so that the components are implemented in the same manner, but from a right-to-left orientation. Those skilled in the art will recognize that modifications and variations can be made without departing from the spirit of the invention. Therefore, it is intended that this invention encompass all such variations and modifications as fall within the scope of the appended claims.

I claim:

1. A circuit for cancelling nonlinearity error associated with component value mismatches in a data converter having a plurality of components which are each selectively switched between first and second terminals to perform a predetermined data conversion, comprising:

arithmetic circuitry for successively receiving a plurality of digital input signals, the arithmetic circuitry successively performing a predetermined arithmetic operation for each digital input signal and using an immediately preceding output of the arithmetic circuitry to provide an output for each received input signal, a first output being provided by using a first of the digital input signals and a predetermined value;

an encoder coupled to the arithmetic circuitry for receiving the output provided in response to each received digital input signal, the encoder translating the output from a first predetermined digital code value to a second predetermined digital code value; and control signal circuitry coupled to the arithmetic circuitry and the encoder, the control signal circuitry providing a plurality of control signals for controlling switching of the plurality of components in a predetermined order to cancel the nonlinearity error by switching a predetermined number of the components for each received digital input signal as determined by the second predetermined digital code value and in a non-repetitive successive order with respect to successive digital input signals, the successive order to switching of components being repeated for subsequent digital input signals after one or more of the digital input signals has generated enough control signals to cause each of the components to be switched once.

2. The circuit of claim 1 wherein the arithmetic circuitry is an N-bit adder, where N is an integer, and each of the plurality of digital input signals is an N-bit signal, the N-bit adder summing a carry out bit, when a carry out bit is generated in connection with providing the initial sum, wherein the summing of the carry out bit with the initial sum provides the final sum.

3. The circuit of claim 1 wherein the control signal circuitry comprises:

a plurality of logic gates which uses: (1) the second predetermined digital code value of an immediately preceding digital input signal except for initially using a reset value; (2) the second predetermined digital code value of a digital input signal being presently processed; and (3) the carry-out bit to provided each of the plurality of control signals.

4. The circuit of claim 3 wherein the plurality of logic gates comprise a plurality of groups of logic gates, each group comprising:

a first exclusive NOR gate having a first input coupled to the encoder for receiving a predetermined bit of the second predetermined digital code value of the digital input signal being presently processed, a second input coupled to the encoder for receiving a predetermined bit of the second predetermined digital code value of the immediately preceding digital input signal, and an output; and a second exclusive NOR gate having a first input coupled to the output of the first exclusive NOR gate, a second input coupled to an inverse of the carry-out bit, and an output for providing one of the control signals.

5. The circuit of claim 3 wherein the control signal circuitry further comprises:

a latch having an input coupled to the encoder and an output coupled to the plurality of logic gates, the latch providing the second predetermined digital code value of the immediately preceding digital input signal.

6. The circuit of claim 5 wherein the arithmetic circuitry is initially reset with a first predetermined initial value as the predetermined value, and the latch is initially reset with a second predetermined initial value as a first output of the latch.

7. The circuit of claim 1 wherein the first predetermined digital code value is a binary code value, and the second predetermined digital code value is a thermometer code value.

8. In a data converter having a plurality of components which are each selectively switched between first and second terminals to perform a predetermined data conversion, a method for cancelling nonlinearity error associated with component value mismatches, comprising the steps of:
   successively receiving a plurality of digital input signals;
   successively performing a predetermined arithmetic operation with each digital input signal and an immediately preceding output of the predetermined arithmetic operation to provide an output for each received input signal, a first arithmetic operation using a predetermined value and a first digital input signal;
   translating the output for each received digital input signal from a first predetermined digital code to a second predetermined digital code value;
   providing a plurality of control signals for controlling switching of the plurality of components in a predetermined order to cancel the nonlinearity error by switching a predetermined number of the components for each received digital input signal as determined by the second predetermined digital code value and in a non-repetitive successive order with respect to successive digital input signals; and
   repeating the successive order of switching of components in response to subsequent digital input signals after the plurality of control signals from one or more of the digital input signals has caused each of the components to be switched once.

9. The method for cancelling nonlinearity error of claim 8 wherein the step of successively receiving a plurality of digital input signals comprises receiving a plurality of digital input signals, each having N bits, where N is an integer, and the step of providing a plurality of control signals comprises providing a plurality of control signals, each plurality having $(2^N-1)$ control signals.

10. The method for cancelling nonlinearity error of claim 8 wherein the step of translating further comprises translating from a binary code to a thermometer code.

11. An error correction circuit for cancelling nonlinearity error associated with component value mismatches in a digital-to-analog (D/A) converter having a plurality of components which are each selectively switched between first and second terminals to perform a predetermined data conversion, comprising:

adder means for successively receiving a plurality of digital input signals, the adder means successively adding each digital input signal with a previously existing sum generated from an immediately preceding digital input signal to provide an initial sum for each received input signal, a first of the digital input signals being summed with a predetermined value, the adder means also selectively adding a carry-out bit to a least significant bit position of the initial sum to provide a final sum for each received digital input signal;

encoding means coupled to the adder means for receiving the final sum provided in response to each received digital input signal, the encoding means translating the final sum from a first predetermined digital code value to a second predetermined digital code value; and output means coupled to the adder means and the encoding means, the output means providing a plurality of control signals for controlling switching of the plurality of components in a predetermined order to cancel the nonlinearity error by switching a predetermined number of the components for each received digital input signal as determined by the second predetermined digital code value and in a non-repetitive successive order with respect to successive digital input signals, the successive order of switching of components being repeated for subsequent digital input signals after one or more of the digital input signals has generated enough control signals to cause each of the components to be switched once.

12. The error correction circuit of claim 11 wherein the output means comprise:
   a plurality of logic gates which uses the second predetermined digital code value of an immediately preceding digital input signal except for initially using a reset value, the second predetermined digital code value of a digital input signal being presently processed, and the carry-out bit to provide each of the plurality of control signals.

13. The error correction circuit of claim 12 wherein the plurality of logic gates comprise a plurality of groups of logic gates, each group comprising:
   a first exclusive NOR gate having a first input coupled to the encoder for receiving the second predetermined digital code value of the digital input signal being presently processed, a second input coupled to the encoder for receiving the second predetermined digital code value of the immediately preceding digital input signal, and an output; and
   a second exclusive NOR gate having a first input coupled to the output of the first exclusive NOR gate, a second input coupled to an inverse of the carry-out bit, and an output for providing one of the control signals.

14. The error correction circuit of claim 11 wherein the encoding means translates the final sum from a binary code value to a thermometer code value.

* * * * *